US011139305B1

(12) United States Patent
Huang et al.

(10) Patent No.: US 11,139,305 B1
(45) Date of Patent: Oct. 5, 2021

(54) RECESSED ACCESS DEVICE AND MANUFACTURING METHOD THEREOF

(71) Applicant: NANYA TECHNOLOGY CORPORATION, New Taipei (TW)

(72) Inventors: Chih-Wei Huang, Taoyuan (TW); Hsu-Cheng Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/993,250

(22) Filed: Aug. 13, 2020

(51) Int. Cl.
*H01L 27/108* (2006.01)
*H01L 29/40* (2006.01)
*H01L 29/423* (2006.01)

(52) U.S. Cl.
CPC .. *H01L 27/10876* (2013.01); *H01L 27/10823* (2013.01); *H01L 29/401* (2013.01); *H01L 29/4236* (2013.01)

(58) Field of Classification Search
None
See application file for complete search history.

(56) References Cited

U.S. PATENT DOCUMENTS 10,170,573 B1 * 1/2019 Chiang ............ H01L 29/66613
10,720,524 B1 * 7/2020 Qiao .................... H01L 29/7811
11,056,576 B1 * 7/2021 Huang .............. H01L 29/66734

\* cited by examiner

*Primary Examiner* — Hsien Ming Lee
(74) *Attorney, Agent, or Firm* — CKC & Partners Co., LLC

(57) ABSTRACT

A manufacturing method for a recessed access device includes the following operations. A trenching is formed in a substrate. A gate oxide layer is formed within the substrate by oxidizing an inner surface of the trench. A first gate layer is formed in a bottom of the trench, wherein a portion of the gate oxide layer above the first gate layer is exposed from the trench. A second gate layer is formed in the trench to cover the first gate layer and the portion of the gate oxide layer and form a recess over the first gate layer, wherein the second gate layer has a vertical portion covering the portion of the gate oxide layer and a horizontal portion having an upper surface exposed from the recess. An ion implantation is performed to the horizontal portion to form a doped horizontal portion.

16 Claims, 16 Drawing Sheets

RECESSED ACCESS DEVICE AND MANUFACTURING METHOD THEREOF

BACKGROUND

Field of Invention

The present invention relates to a recessed access device and a manufacturing method thereof.

Description of Related Art

Accompanying with the development of semiconductor devices, the techniques of high density of transistors and transistors with shorter channel lengths are highly demanded to increase the operating speed and performance of the devices. The shorter channels lengths have the problem of short channel effects, which limit the performance of the devices.

Metal gate recessed access devices (RADs) for dynamic random access memory (DRAM) have been demonstrated that having higher data retention compared to a planar access device. However, gate induced drain leakage (GIDL) may occur between the gate and the drain in the semiconductor devices. Therefore, there is a need for a novel recessed access device technique to overcome the problem mentioned above.

SUMMARY

One aspect of the present disclosure is to provide a manufacturing method for a recessed access device. The method includes the following operations. A trench is formed in a substrate. A gate oxide layer is formed within the substrate by oxidizing an inner surface of the trench. A first gate layer is formed in a bottom of the trench, wherein a portion of the gate oxide layer above the first gate layer is exposed from the trench. A second gate layer is formed in the trench to cover the first gate layer and the portion of the gate oxide layer and form a recess over the first gate layer, wherein the second gate layer has a vertical portion covering the portion of the gate oxide layer and a horizontal portion having an upper surface exposed from the recess. An ion implantation is performed to the horizontal portion to form a doped horizontal portion. The doped horizontal portion is removed to expose the first gate layer. A third gate layer is formed to fill the recess, wherein a material of the third gate layer is the same as that of the first gate layer.

According to some embodiments of the present disclosure, the manufacturing method further includes a source/drain region is formed in the substrate and adjacent to the gate oxide layer.

According to some embodiments of the present disclosure, the manufacturing method further includes a first top portion of the third gate layer and a second top portion of the second gate layer are etched back.

According to some embodiments of the present disclosure, a first upper surface of the second gate layer is substantially coplanar with a second upper surface of the third gate layer, after etching back the first top portion of the third gate layer and the second top portion of the second gate layer.

According to some embodiments of the present disclosure, a first upper surface of the second gate layer is below a second upper surface of the third gate layer, after etching back the first top portion of the third gate layer and the second top portion of the second gate layer.

According to some embodiments of the present disclosure, the first gate layer is formed by an anisotropic deposition.

According to some embodiments of the present disclosure, the ion implantation is a blanket implantation.

According to some embodiments of the present disclosure, removing the doped horizontal portion to expose the first gate layer is performed by a wet etching process.

One aspect of the present disclosure is to provide a recessed access device. The recessed access device includes a substrate, a first recessed access device gate and a first gate oxide layer. The first recessed access device gate is embedded in the substrate. The first gate oxide layer is disposed between the substrate and the first recessed access device gate, wherein the first recessed access device gate includes a first gate material and a second gate material. The first gate material is disposed on the first gate oxide layer, wherein the first gate material includes a first lower portion and a first upper portion on the first lower portion. The second gate material is disposed between the first upper portion of the first gate material and the first gate oxide layer.

According to some embodiments of the present disclosure, the recessed access device further includes a source/drain region embedded in the substrate and adjacent to the first gate oxide layer.

According to some embodiments of the present disclosure, a first upper surface of the first upper portion of the first gate material is substantially coplanar with a second upper surface of the second gate material.

According to some embodiments of the present disclosure, a first upper surface of the first upper portion of the first gate material is above a second upper surface of the second gate material.

According to some embodiments of the present disclosure, the recessed access device further includes a second recessed access device gate and a second gate oxide layer. The second recessed access device gate is embedded in the substrate. The second gate oxide layer is disposed between the substrate and the second recessed access device gate, wherein the second recessed access device gate includes a third gate material and a fourth gate material. The third gate material is disposed on the second gate oxide layer, wherein the third gate material includes a second lower portion and a second upper portion on the second lower portion, and the third gate material is the same as the first gate material. The fourth gate material is disposed between the second upper portion of the third gate material and the second gate oxide layer, wherein the fourth gate material is the same as the second gate material.

According to some embodiments of the present disclosure, a first width of the first recessed access device gate is smaller than a second width of the second recessed access device gate.

According to some embodiments of the present disclosure, a first height of the first recessed access device gate is substantially equal to a second height of the second recessed access device gate.

According to some embodiments of the present disclosure, a ratio of a first height of the first gate material to a second height of the second gate material is 2:1 to 4:1.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
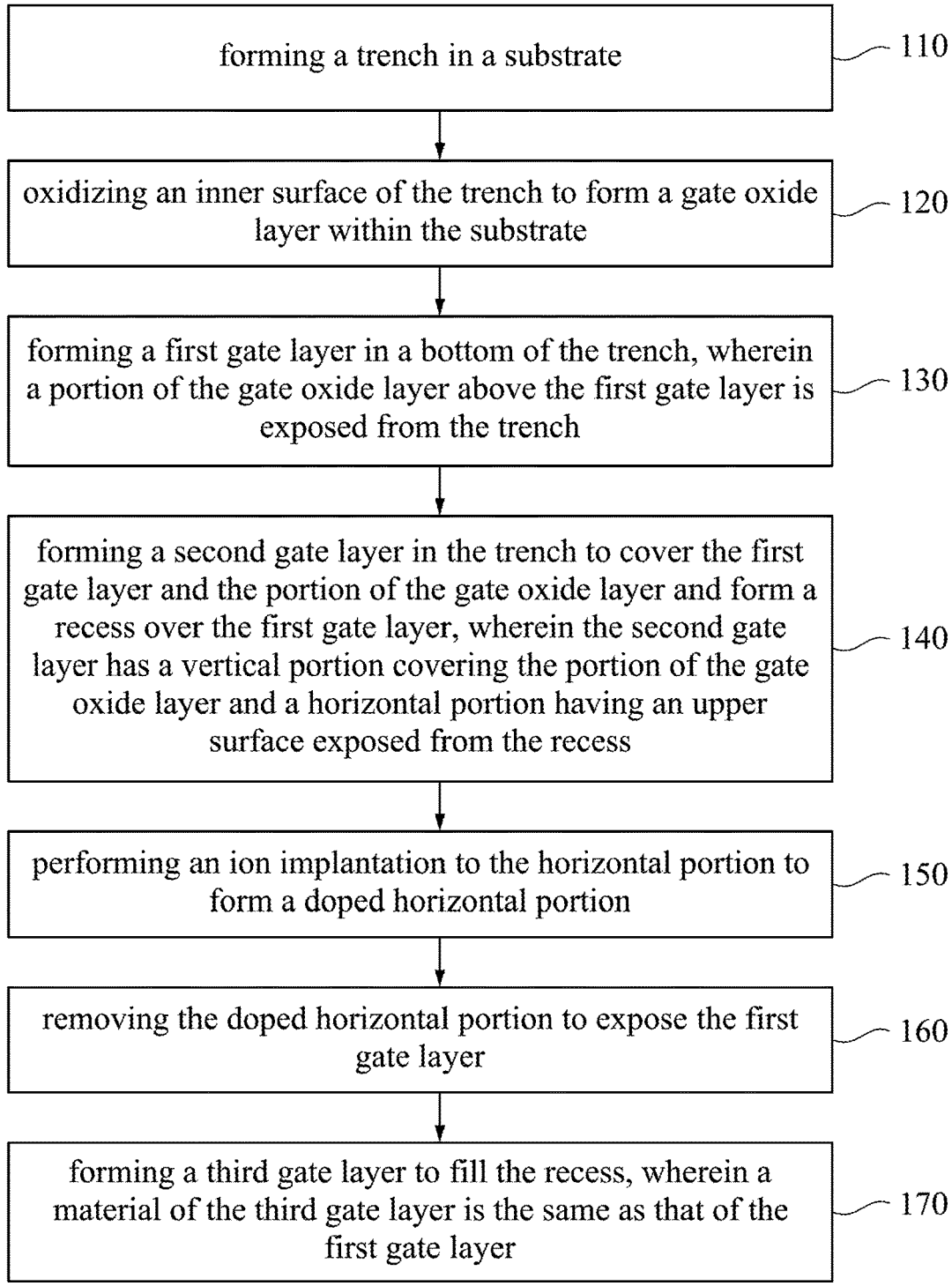
FIG. 1 is a flowchart of a manufacturing method for a recessed access device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of manufacturing a metal gate recessed access device (RAD) for dynamic random access memory (DRAM) includes several processes. The heights of gates of a RAD are determined by an etch back process of manufacturing the RAD. Traditionally, the heights of the gates of the RAD are hard to control because the widths of the gates of the RAD may be different. Therefore, due to the height differences of the gates of the RAD, GIDL would occur, thereby affecting DRAM's performance. The present disclosure provides a manufacturing method for a recessed access device, which can improve the problems mentioned above. Although the widths of the gates of the RAD are different, the present disclosure can control the etching depths of different gates of the RAD during the etch back process, thereby controlling the heights of the gates of the RAD.

FIG. 1 is a flowchart of a manufacturing method 100 for a recessed access device in accordance with some embodiments of the present disclosure. Operation 110 of the method is forming a trench in a substrate. The method continues with operation 120 in which a gate oxide layer is formed within the substrate by oxidizing an inner surface of the trench. Operation 130, a first gate layer is formed in a bottom of the trench, wherein a portion of the gate oxide layer above the first gate layer is exposed from the trench. The method continues with operation 140 in which a second gate layer is formed in the trench to cover the first gate layer and the portion of the gate oxide layer and form a recess over the first gate layer, wherein the second gate layer has a vertical portion covering the portion of the gate oxide layer and a horizontal portion having an upper surface exposed from the recess. Operation 150, an ion implantation is performed to the horizontal portion to form a doped horizontal portion. The method continues with operation 160 in which the doped horizontal portion is removed to expose the first gate layer. The method continues with operation 170 in which a third gate layer is formed to fill the recess, wherein a material of the third gate layer is the same as that of the first gate layer. It is understood that FIG. 1 has been simplified for a good understanding of the concepts of the present disclosure. Accordingly, it should be noted that additional processes may be provided before, during, and after the methods of FIG. 1, and that some other processes may only be briefly described herein.

FIG. 2 to FIG. 19 are cross-sectional views of a manufacturing method for a recessed access device at various stages in accordance with some embodiments of the present disclosure.

Figure 2:
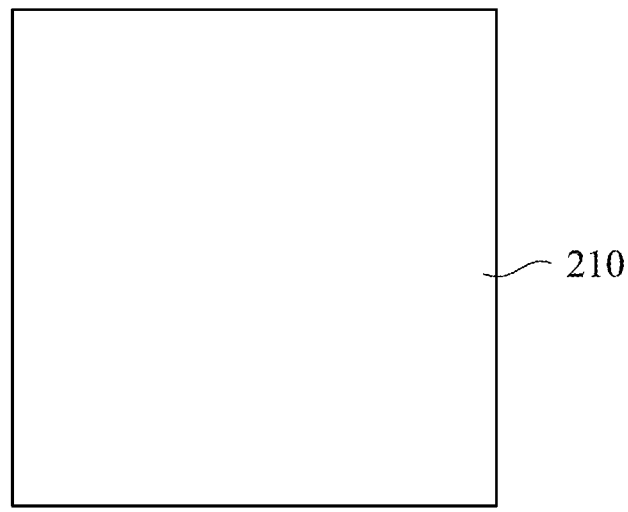
FIG. 2 to FIG. 19 are cross-sectional views of a manufacturing method for a recessed access device at various stages in accordance with some embodiments of the present disclosure.

Please refer to FIG. 2, a substrate 210 is provided. The substrate 210 may be, for example, a bulk single crystal silicon substrate, a silicon-on-insulator (SOI) substrate, or some other suitable semiconductor substrate. In some embodiments, the substrate 210 is made of silicon (Si), germanium (Ge), silicon carbide (SiC), gallium arsenide (GaAs), and/or a combination thereof or other suitable semiconductor substrates.

Figure 3:
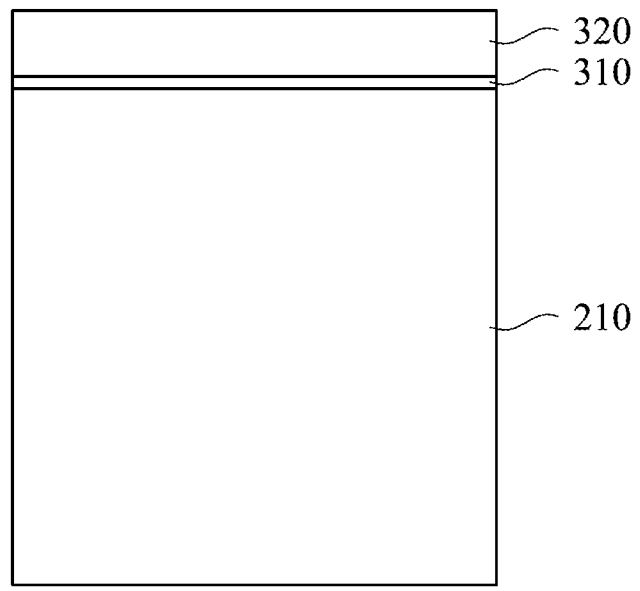

As shown in FIG. 3, a dielectric layer 310 is formed on the substrate 210, and a mask 320 is formed on the dielectric layer 310. That is, the dielectric layer 310 is disposed between the substrate 210 and the mask 320. In some embodiments, the dielectric layer 310 includes silicon dioxide, silicon nitride, silicon oxy-nitride, tetraethoxysilane (TEOS) oxide, a low-k material and/or a combination thereof or other suitable dielectric material. In some embodiments, the mask 320 is a photoresist or a hard mask. For example, the material of the mask 320 may be silicon nitride or some other suitable mask material. In some embodiments, the dielectric layer 310 is formed by deposition methods including thermal oxidation, low-pressure chemical vapor deposition (LPCVD), atmospheric-pressure chemical vapor deposition (APCVD), plasma-enhanced chemical vapor deposition (PECVD), or other suitable deposition processes. In some embodiments, the mask 320 is formed by processes including spin coating, physical vapor deposition (PVD), chemical vapor deposition (CVD), evaporation, sputtering, or other suitable processes. By way of example and not limitation, a chemical mechanical polishing (CMP) process is performed after the mask 320 is formed.

Figure 4:
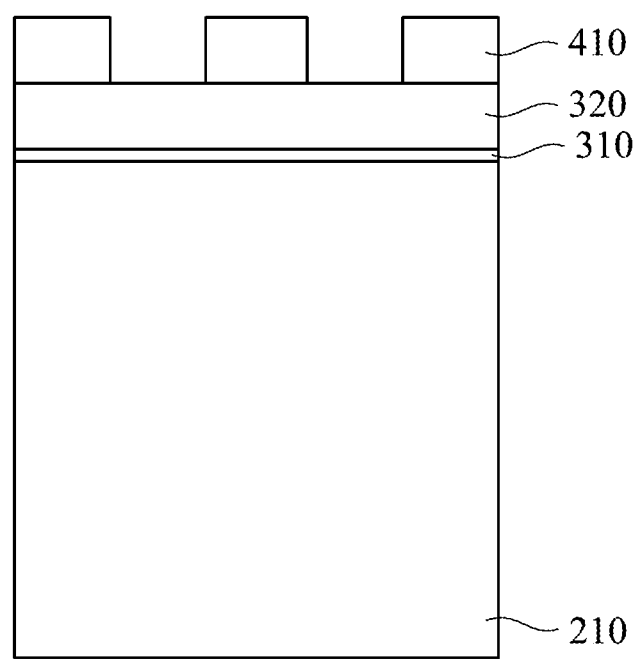

Please refer to FIG. 4, a patterned mask layer 410 is disposed on the mask 320 and is used as an etching mask layer to perform an etching process or multiple etching process. In some embodiments, the etching process is an anisotropic etching process or an isotropic etching process. In some embodiments, the etching process is a dry etching process or a wet etching process.

Figure 5A:
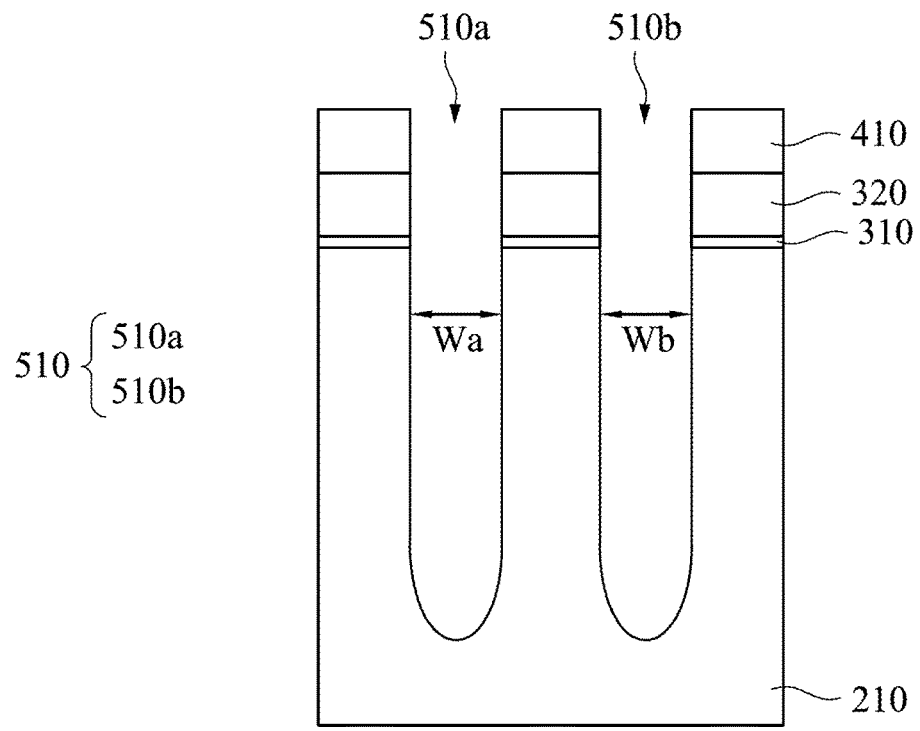
Figure 5B:
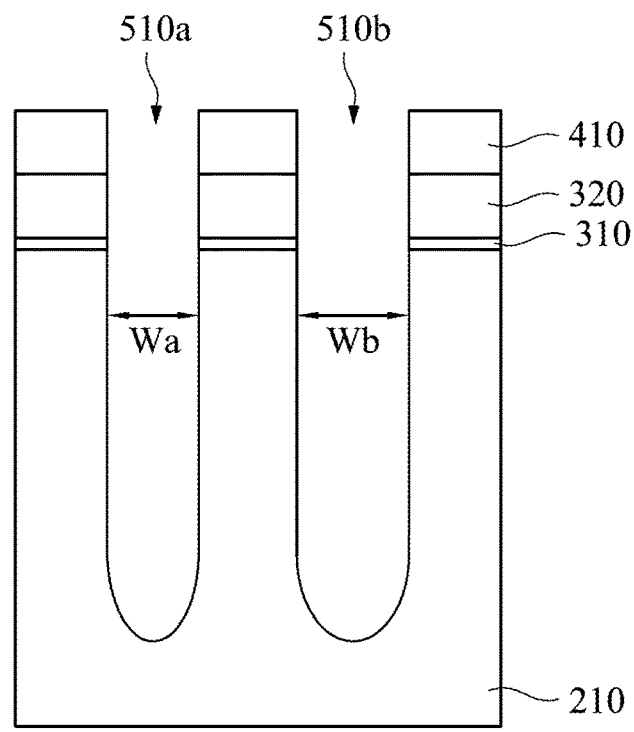
Figure 6:
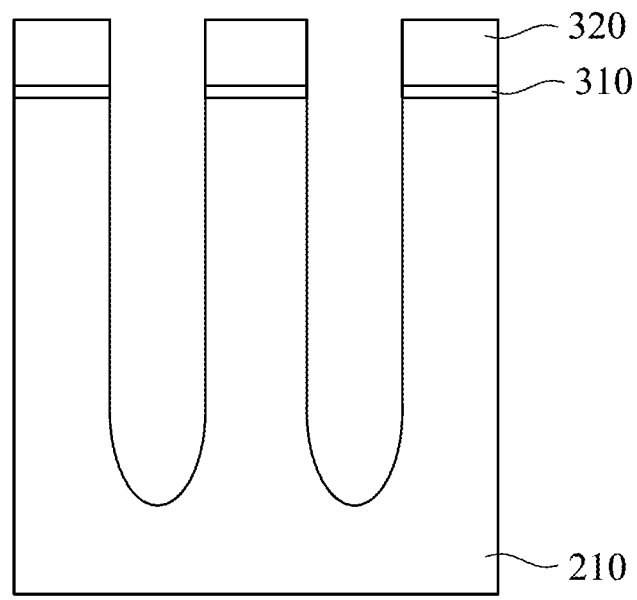

Please refer to FIG. 5A and FIG. 5B, trenches 510 are formed through the dielectric layer 310, the mask 320, and in the substrate 210 by an etching process or multiple etching processes (the operation 110 of FIG. 1). The trenches 510 include a first trench 510a having a first width Wa and a second trench 510b having a second width Wb. In some embodiments, the first width Wa of the first trench 510a is equal to the second width Wb of the second trench 510b, as shown in FIG. 5A. In some embodiments, the first width Wa of the first trench 510a is smaller than the second width Wb of the second trench 510b, as shown in FIG. 5B. It is noted that the widths of the trenches can be adjusted. After trenches 510 are formed, the patterned mask layer 410 is removed, as shown in FIG. 6.

Figure 7:
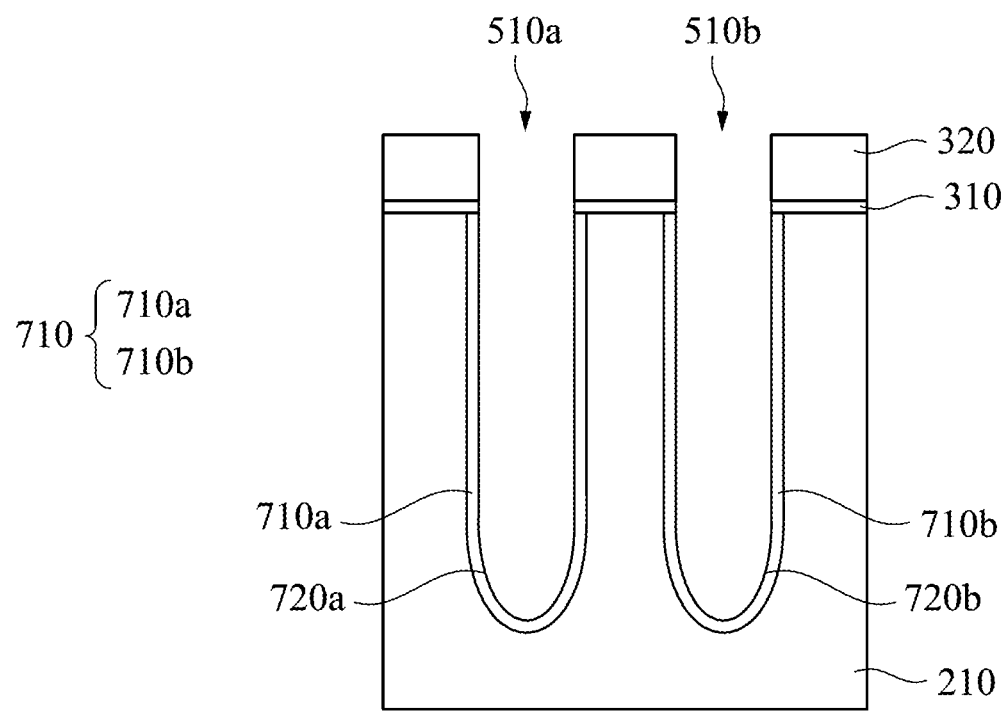

Please refer to FIG. 7, gate oxide layers 710 are formed within the substrate 210 by oxidizing a first inner surface 720a of the first trench 510a and a second inner surface 720b of the second trench 510b (the operation 120 of FIG. 1). The gate oxide layers 710 include a first gate oxide layer 710a and a second gate oxide layer 710b. It is to be understood that the gate oxide layers 710 are within the substrate 210. More specifically, the first gate oxide layer 710a and the second gate oxide layer 710b are within the substrate 210. In some embodiments, the gate oxide layers 710 can be formed by deposition methods such as thermal oxidation, low-pressure chemical vapor deposition (LPCVD), atmospheric-pressure chemical vapor deposition (APCVD), plasma-enhanced chemical vapor deposition (PECVD), or other suitable deposition processes.

Figure 8:
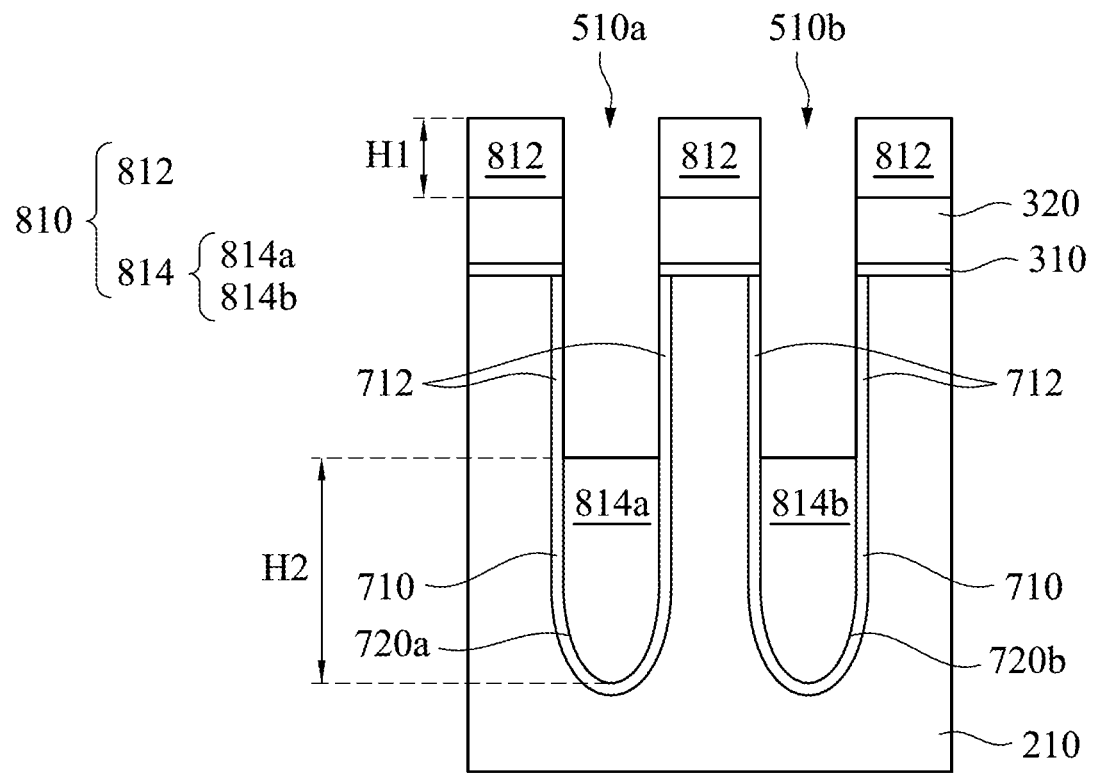

Please refer to FIG. 8, a first gate layer 810 is formed (the operation 130 of FIG. 1). The first gate layer 810 includes an upper part 812 and a lower part 814, wherein the lower part 814 includes a first lower part 814a and a second lower part 814b. The upper part 812 has a first height H1, and the lower part 814 has a second height H2. The upper part 812 is formed on the mask 320. The lower part 814 is formed in bottoms of the first trench 510a and the second trench 510b, wherein a portion 712 of the gate oxide layers 710 above the lower part 814 is exposed from the first trench 510a and the second trench 510b. It is emphasized that the first gate layer 810 is not deposited on the portion 712 of the gate oxide layers 710. In some embodiments, the first height H1 of the upper part 812 is smaller than the second height H2 of the lower part 814. In some embodiments, the first height H1 of the upper part 812 is the same as the second height H2 of the lower part 814. In some embodiments, the first height H1 of the upper part 812 is greater than the second height H2 of the lower part 814. It should be noticed that the height H1 of the upper part 812 and the second height H2 of the lower part 814 are adjustable. The first gate layer 810 may be a conductive material, and the conductive material can be selected from the group consisting of amorphous silicon, polycrystalline silicon, polycrystalline silicon germanium, metal nitride, metal silicide, metal oxide and metal. In some embodiments, the first gate layer 810 is titanium nitride (TiN). The first gate layer 810 may be formed by deposition methods such as PVD, CVD, sputtering, or other suitable processes. In some embodiments, the first gate layer 810 is formed by an anisotropic deposition, in which the AC power of the deposition machine can be adjusted.

Figure 9:
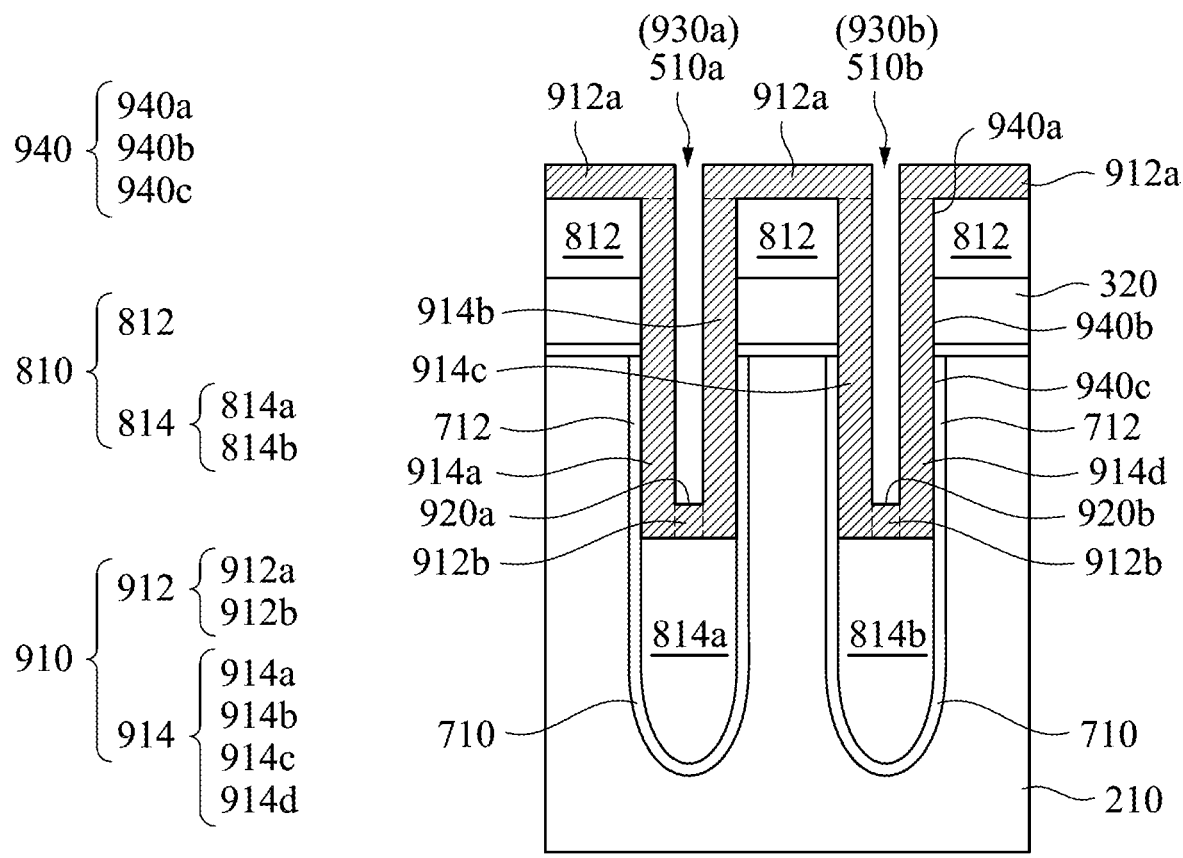

Please refer to FIG. 9, a second gate layer 910 is formed (the operation 140 of FIG. 1). The second gate layer 910 includes a horizontal portion 912 and a vertical portion 914. The horizontal portion 912 includes a top portion 912a and a bottom portion 912b, wherein the a bottom portion 912b has a first upper surface 920a exposed from the first recess 930a and a second upper surface 920b exposed from the second recess 930b. The horizontal portion 912 is formed on the upper part 812 of the first gate layer 810 and the lower part 814 of the first gate layer 810. The vertical portion 914 includes a first vertical portion 914a, a second vertical portion 914b, a third vertical portion 914c and a fourth vertical portion 914d. The first vertical portion 914a and the second vertical portion 914b are on the first lower part 814a of the first gate layer 810. The third vertical portion 914c and the fourth vertical portion 914d are on the second lower part 814b of the first gate layer 810. Sidewalls 940 are covered by the vertical portion 914, wherein the sidewalls 940 include first sidewalls 940a of the upper part 812 of the first gate layer 810, second sidewalls 940b of the mask 320, and third sidewalls 940c of the portion 712 of the gate oxide layers 710. In some embodiments, the second gate layer 910 is in the first trench 510a to cover the lower part 814 of the first gate layer 810, and to cover the portion 712 of gate oxide layers 710, thereby forming the first recess 930a over the first gate layer 810. The second gate layer 910 may be a conductive material, and the conductive material can be selected from the group of amorphous silicon, polycrystalline silicon, polycrystalline silicon germanium, metal nitride, metal silicide, metal oxide and other suitable metal. In some embodiments, the first gate layer 810 is polycrystalline silicon. In some embodiments, the material of the first gate layer 810 is different from that of the second gate layer 910. In some embodiments, the material of the first gate layer 810 is the same as that of the second gate layer 910. In some embodiments, the second gate layer 910 is formed by deposition methods such as PVD, CVD, sputtering, or other suitable processes. In some embodiments, the second gate layer 910 is formed by an isotropic deposition.

Figure 10:
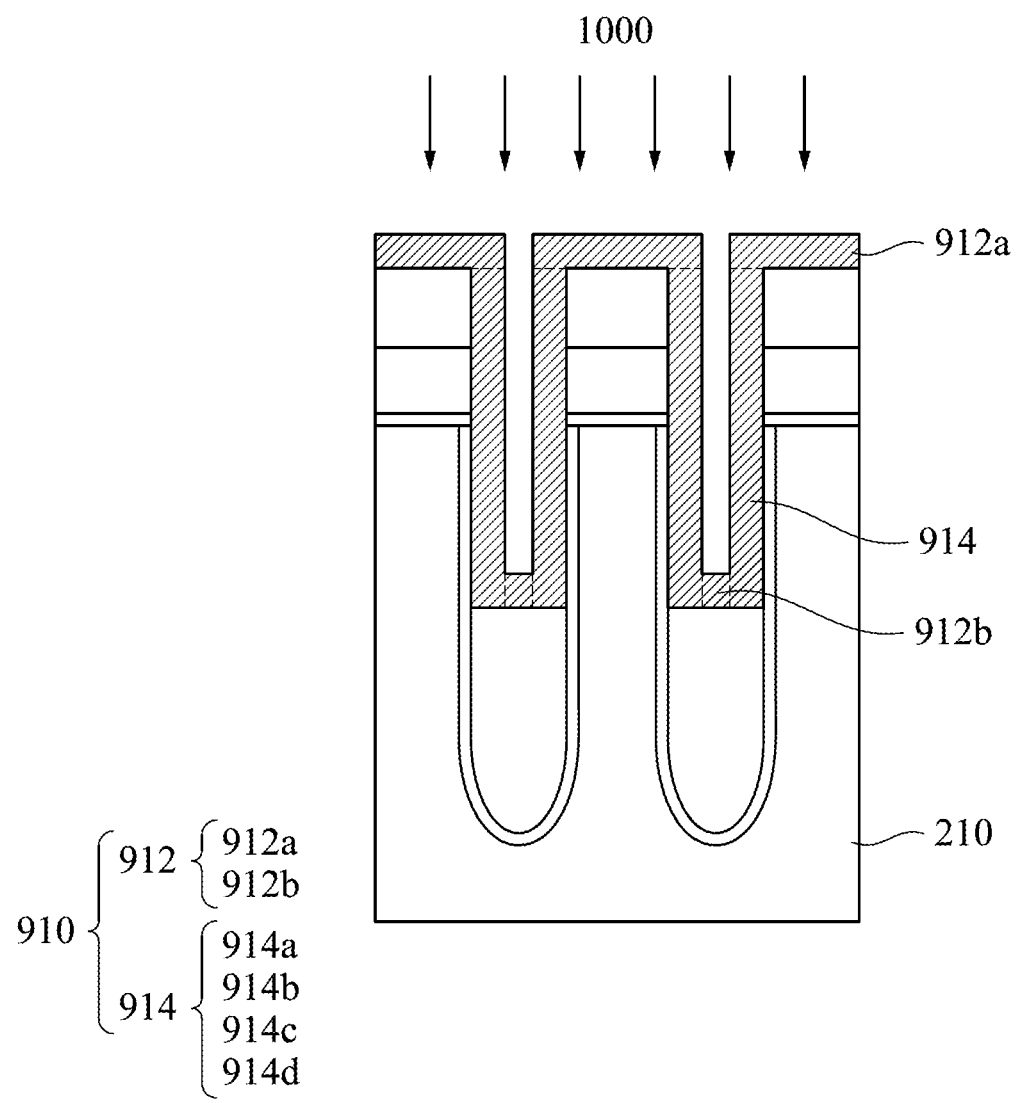
Figure 11:
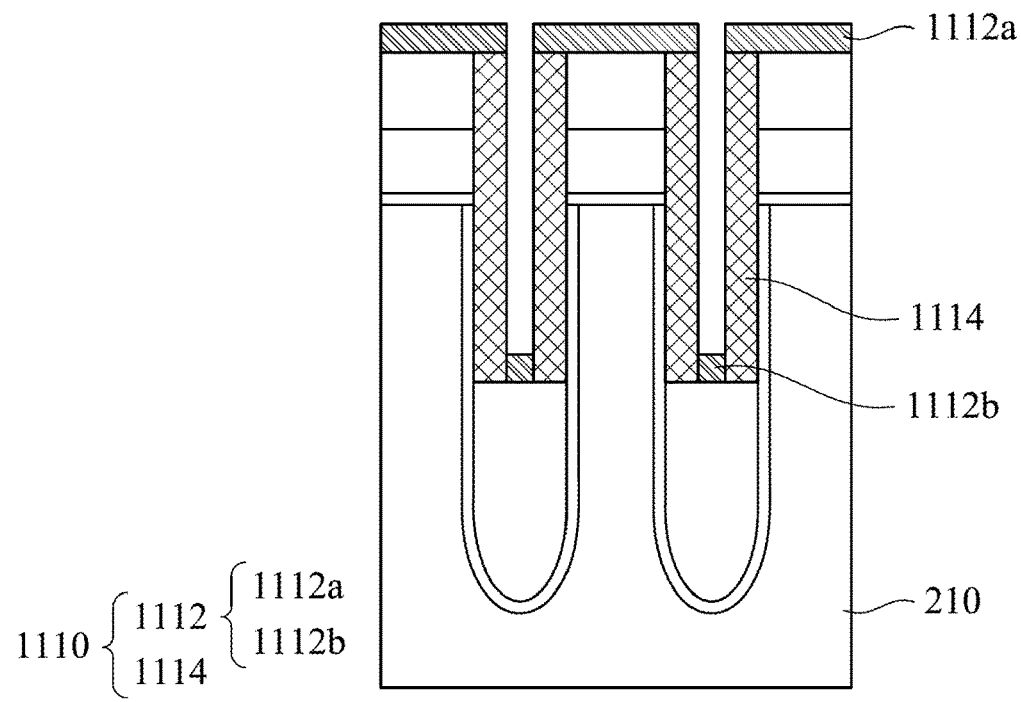

Please refer to FIG. 10 and FIG. 11, a first ion implantation 1000 is performed on the second gate layer 910 (the operation 150 of FIG. 1). In some embodiments, the doping material of the first ion implantation 1000 is silicon, germanium, gallium arsenide, indium arsenide, indium phosphide, silicon carbide, or other suitable materials. The second gate layer 910 includes the horizontal portion 912 (the top portion 912a and the bottom portion 912b) and the vertical portion 914 (the first vertical portion 914a, the second vertical portion 914b, the third vertical portion 914c and the fourth vertical portion 914d). In other words, the doping region includes the top portion 912a, the bottom portion 912b and the vertical portion 914 of the second gate layer 910. In some embodiments, the first ion implantation 1000 is a blanket implantation. After the first ion implantation 1000 is performed, the second gate layer 910 becomes a doped second gate layer 1110, wherein the doped second gate layer 1110 includes a doped horizontal portion 1112 and a doped vertical portion 1114, as shown in FIG. 11. In other words, the horizontal portion 912 in FIG. 10 is the doped horizontal portion 1112 in FIG. 11, and the vertical portion 914 in FIG. 10 is the doped vertical portion 1114 in FIG. 11. The doped horizontal portion 1112 includes a top doped region 1112a and a bottom doped region 1112b. It is to be understood that the horizontal portion 912 becomes the doped horizontal portion 1112, and the vertical portion 914 becomes the doped vertical portion 1114. In some embodiments, the doped horizontal portion 1112 has high doping concentration and the doped vertical portion 1114 has low doping concentration. In other words, the doped horizontal portion 1112 having high doping concentration and the doped vertical portion 1114 having low doping concentration are formed after the first ion implantation 1000 is performed.

Figure 12:
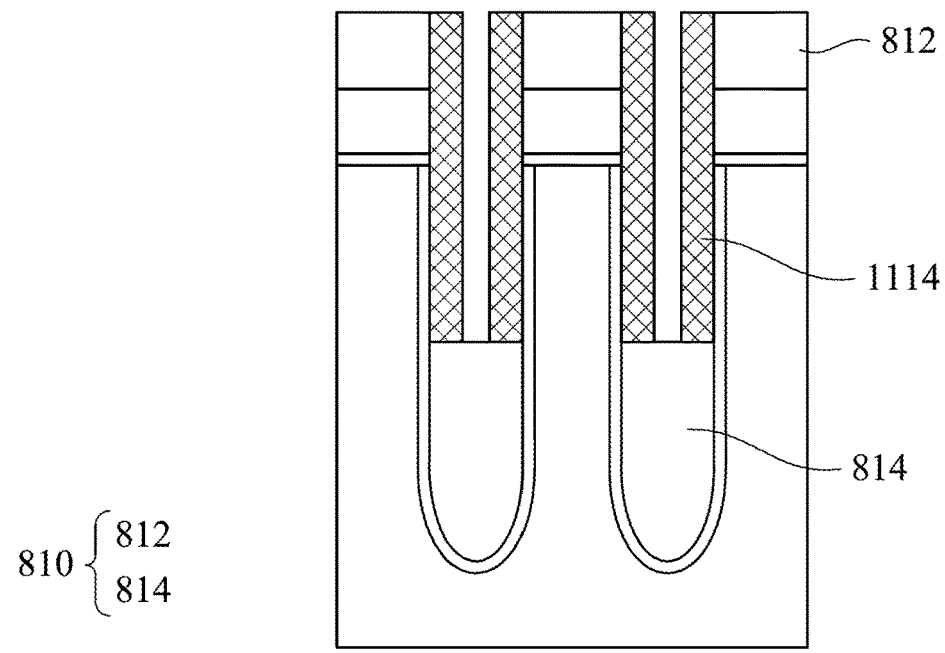

Please refer to FIG. 12, the doped horizontal portion 1112 is removed to expose the first gate layer 810 (the operation 160 of FIG. 1), wherein the first gate layer 810 includes the upper part 812 and the lower part 814. In other words, the doped second gate layer 1110 is partially removed. The doped horizontal portion 1112 can be removed by a suitable etching process. In some embodiments, the etching process is a wet etching or a dry etching. As for a wet etching process, the etching solution may include tetra-methyl ammonium hydroxide (TMAH), $NH_4OH$, KOH HF, other suitable solutions, or a combination thereof. As for a dry etching process, the etching gas may include $CF_4$, $NF_3$, $SF_6$, He, other suitable gases or a combination thereof. In some embodiments, the doped horizontal portion 1112 is removed to expose the first gate layer 810 by a wet etching process. It is to be understood that an etching rate of the doped horizontal portion 1112 having high doping concentration is higher than that of the doped vertical portion 1114 having low doping concentration during the etching process.

Figure 13:
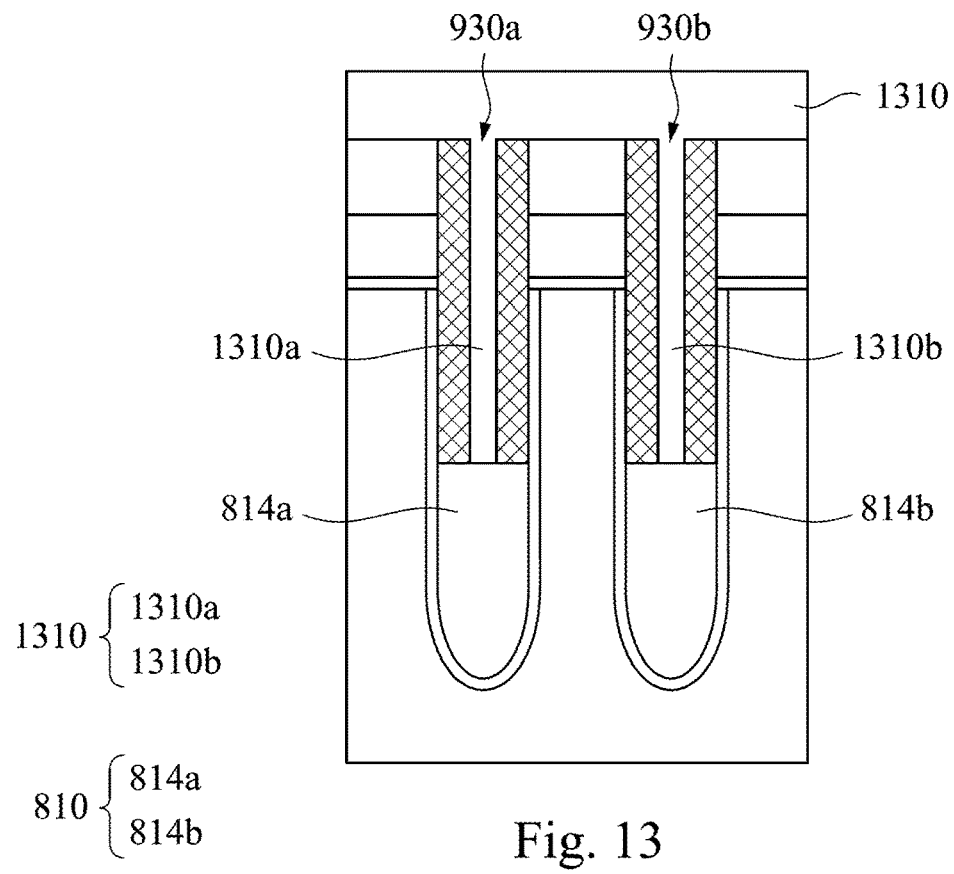

Please refer to FIG. 13, a third gate layer 1310 is formed to fill the first recess 930a and the second recess 930b (the operation 170 of FIG. 1). The third gate layer 1310 includes a portion 1310a and a portion 1310b. That is, the first recess 930a and the second recess 930b are filled with the portion 1310a and the portion 1310b of the third gate layer 1310. In some embodiments, a material of the third gate layer 1310 is the same as that of the first gate layer 810. In some embodiments, the third gate layer 1310 is titanium nitride (TiN). In some embodiments, the third gate layer 1310 is formed by deposition methods such as PVD, CVD, sputtering, or other suitable processes. In some embodiments, the deposition is an isotropic deposition or an anisotropic deposition. In some embodiments, the third gate layer 1310 is formed by an isotropic deposition. In one embodiment, the method for forming the third gate layer 1310 is different from that of the first gate layer 810.

Figure 14:
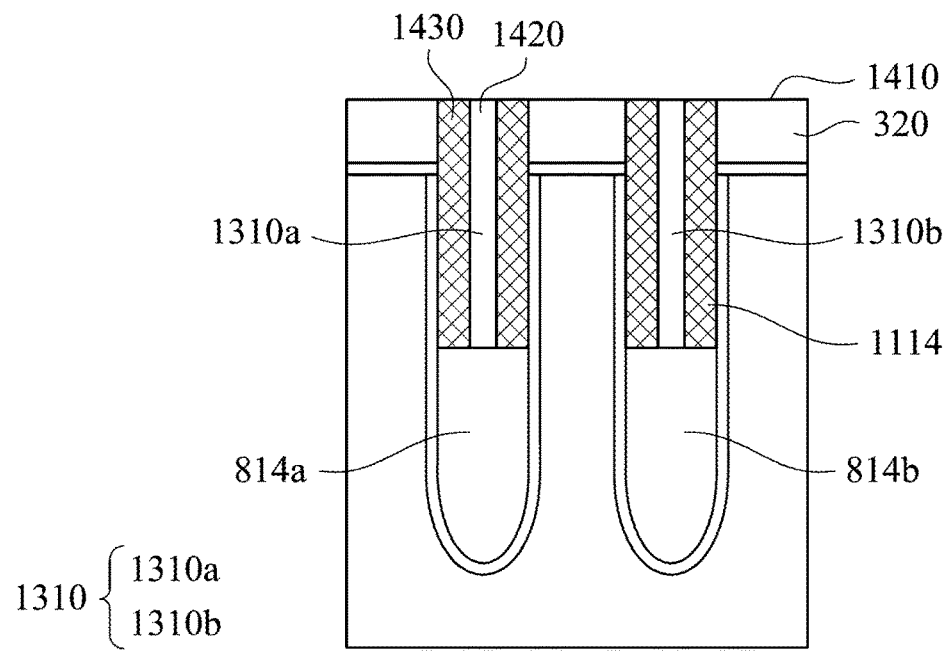

Please refer to FIG. 14, a planarization process is performed. In some embodiments, the planarization process is performed by a CMP process, and the CMP process stops on a surface 1410 of the mask 320. That is, the third gate layer 1310 and the doped vertical portion 1114 of the doped second gate layer 1110 are partially removed by the planarization process. Therefore, a partial portion 1310a remains on the first lower part 814a of the first gate layer 810 and a partial portion 1310b remains on the second lower part 814b of the first gate layer 810. In this way, a substantially flattening plane is formed.

Figure 15A:
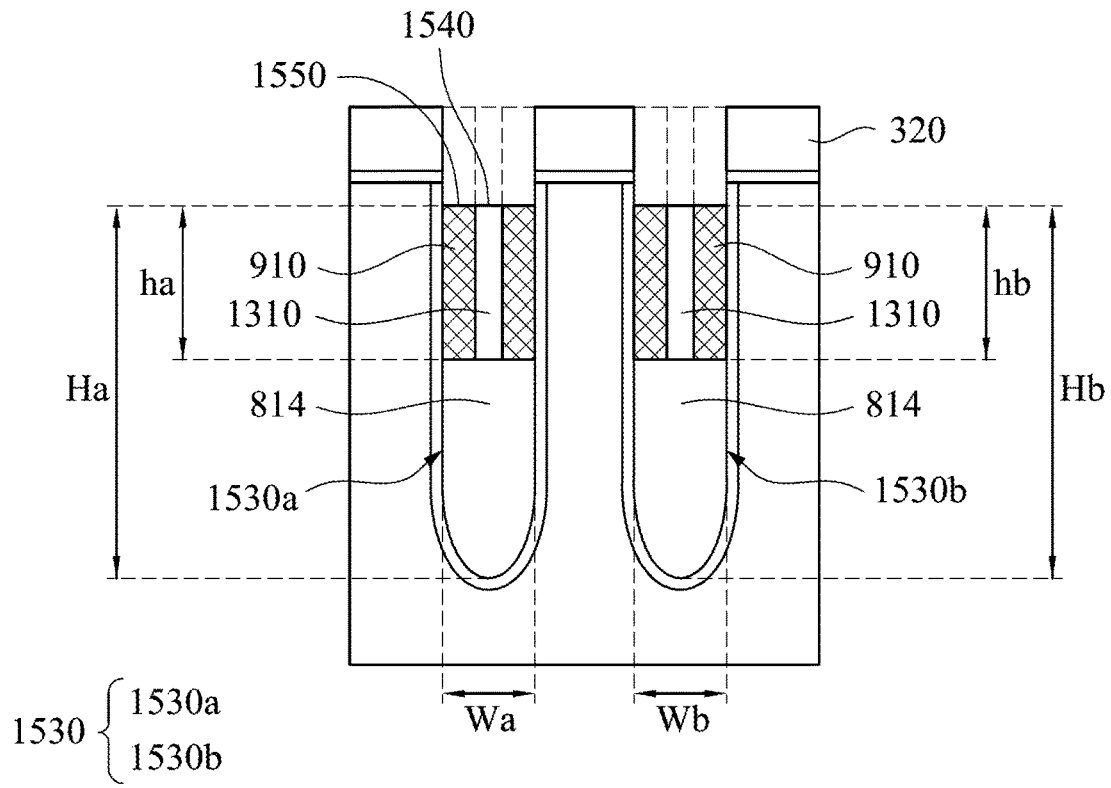
Figure 15B:
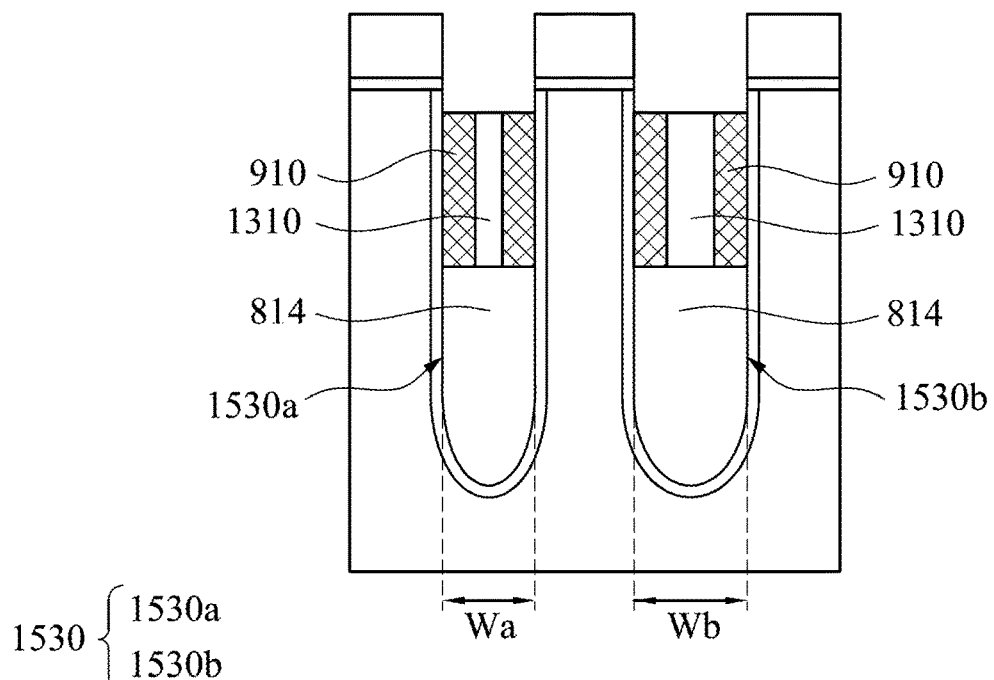
Figure 15C:
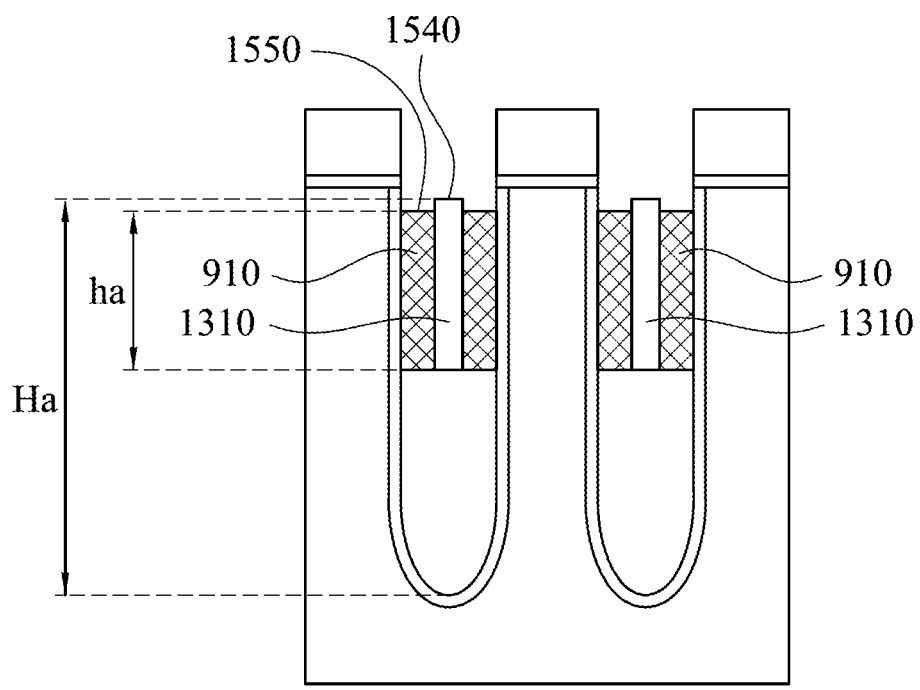

FIG. 15A to FIG. 15C are cross-sectional views of a manufacturing method for a recessed access device at etching back stage in accordance with some embodiments of the present disclosure.

Please refer to FIGS. 15A and 15C, a first top portion 1420 of the third gate layer 1310 and a second top portion 1430 of the second gate layer 910 are etched back. It is to be understood that the etching selectivity may be quantitatively represented by a ratio of the etch rate of the third gate layer 1310 to the second gate layer 910. In some embodiments, when the etching rate of the second gate layer 910 is the same to that of the third gate layer 1310, a first upper surface 1550 of the second gate layer 910 is substantially coplanar with a second upper surface 1540 of the third gate layer 1310, as shown in FIG. 15A. In some embodiments, when the etching rate of the second gate layer 910 is greater than that of the third gate layer 1310, the first upper surface 1550 of the second gate layer 910 is below the second upper surface 1540 of the third gate layer 1310, as shown in FIG. 15C. The etching back process is performed by a suitable etching process. In some embodiments, the etching process is a wet etching or a dry etching. The etching solutions or etching gases used would be the same as or different from the etching process mentioned above. In some embodiments, the etching process is a dry etching process. In some embodiments, it is to be understood that the mask 320 is used as a hard mask, and so only the first top portion 1420 of the third gate layer 1310 and the second top portion 1430 of the second gate layer 910 would be etched back.

Please refer to FIGS. 15A and 15B, after the etching back process, recess accessed device (RAD) gates 1530 are formed. RAD gates 1530 include a first RAD gate 1530a and a second RAD gate 1530b. RAD gates 1530 include the lower part 814 of the first gate layer 810, the third gate layer 1310 and the second gate layer 910. The first RAD gate 1530a has a height Ha, the width Wa, and the second gate layer 910 of the first RAD gate 1530a has a height ha. The second RAD gate 1530b has a height Hb, the width Wb, and the second gate layer 910 of the second RAD gate 1530b has a height hb. In some embodiments, the height Ha is the same as the height Hb, and the height ha is the same as the height hb. In some embodiments, a first ratio of the height ha to the height Ha is 1:2 to 1:4, and a second ratio of the height hb to the height Hb is 1:2 to 1:4. In some embodiments, the first ratio is the same as the second ratio. In some embodiments, the width Wa is the same as the width Wb, as shown in FIG. 15A. In some embodiments, the width Wa is smaller than the width Wb, as shown in FIG. 15B.

Figure 16:
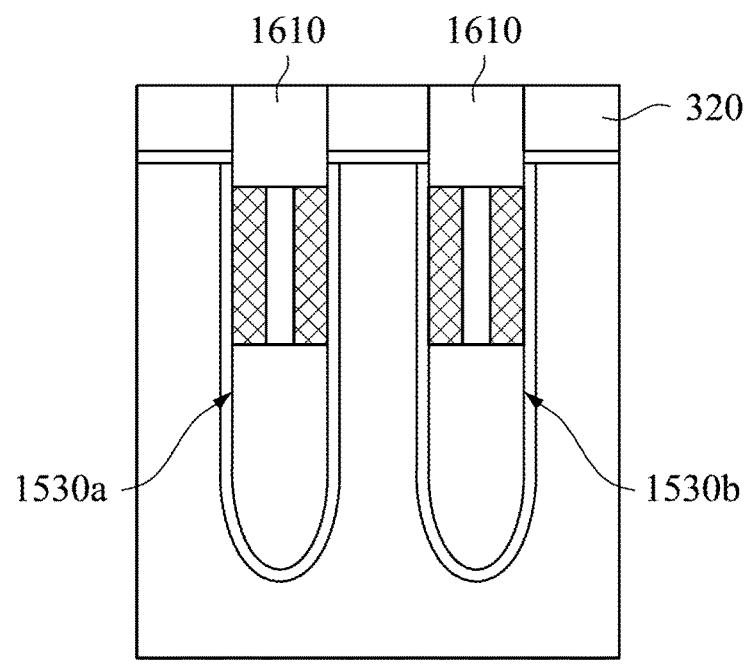

Please refer to FIG. 16, a covering layer 1610 is formed to at least cover the first RAD gate 1530a and the second RAD gate 1530b. In some embodiments, the covering layer 1610 is a photoresist or a hard mask. For example, the material of the covering layer 1610 is silicon nitride or some other suitable mask material. In some embodiments, the material of the covering layer 1610 is the same as that of the mask 320. The covering layer 1610 can be formed by a process including spin coating, PVD, CVD, evaporation, sputtering, or other suitable processes.

Figure 17:
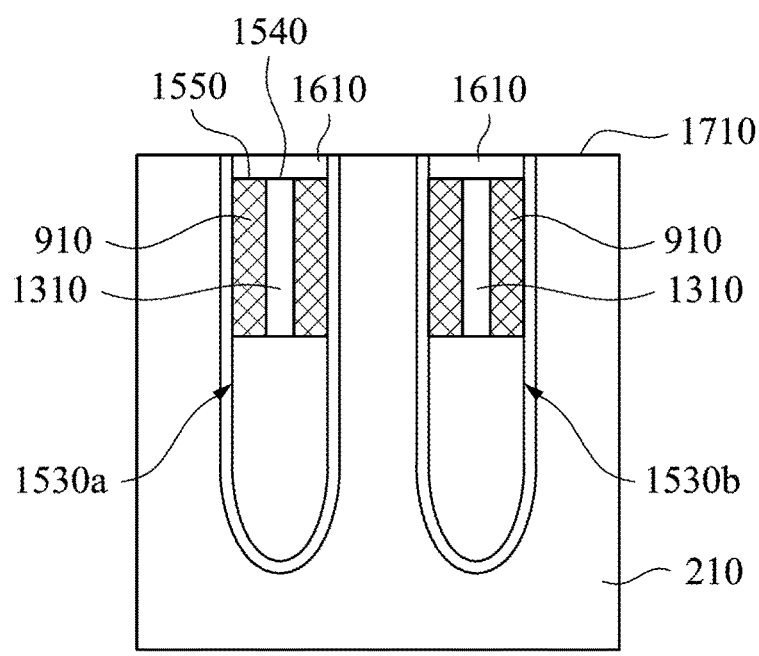

Please refer the FIG. 17, a planarization process is performed. In some embodiments, the planarization process is performed by a CMP process, and the CMP process stops on a surface 1710 of the substrate 210. That is, the mask 320 is fully removed and the covering layer 1610 is partially removed, thereby remaining a portion of the covering layer 1610 on the first upper surface 1550 of the second gate layer 910 and the second upper surface 1540 of the third gate layer 1310.

Figure 18:
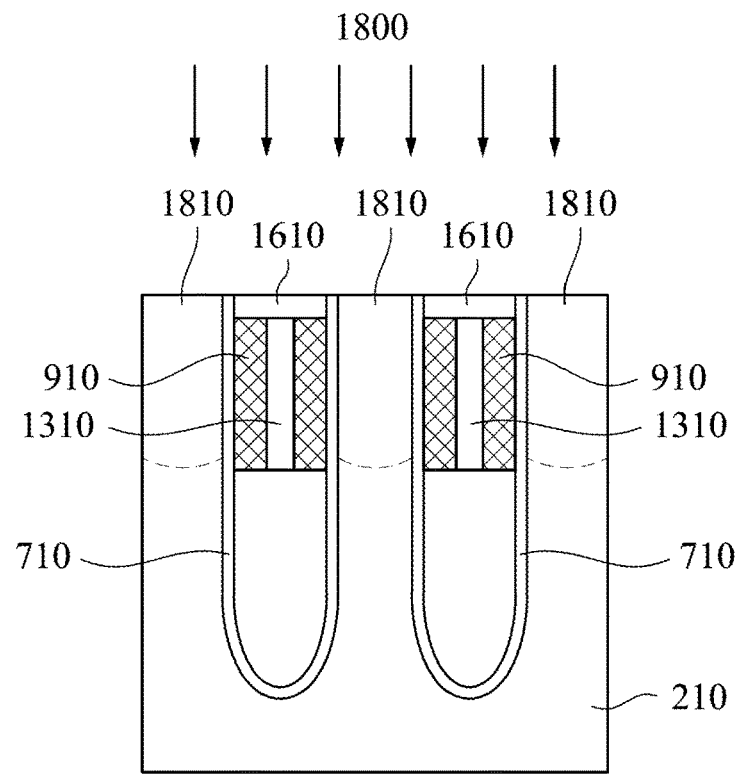

Please refer to FIG. 18, a second ion implantation 1800 is performed on the substrate 210, thereby forming source/drain regions 1810 in the substrate 210 and adjacent to gate oxide layers 710. In some embodiments, the material of the source/drain regions 1810 includes a doped semiconductor material such as silicon or germanium, a compound-doped semiconductor material such as gallium arsenide, indium arsenide, indium phosphide, or silicon carbide, or other suitable one or more of the materials. It is to be understood that the covering layer 1610 is used as a hard mask, so the second gate layer 910 and the third gate layer 1310 would not be doped.

Figure 19:
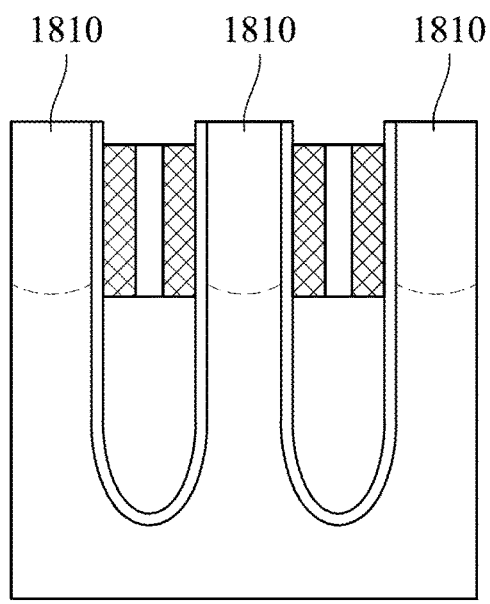

Please refer to FIG. 19, the covering layer 1610 is removed. In some embodiments, the covering layer 1610 can be removed by an etching process. The etching process may be the etching processes mentioned above.

Figure 20A:
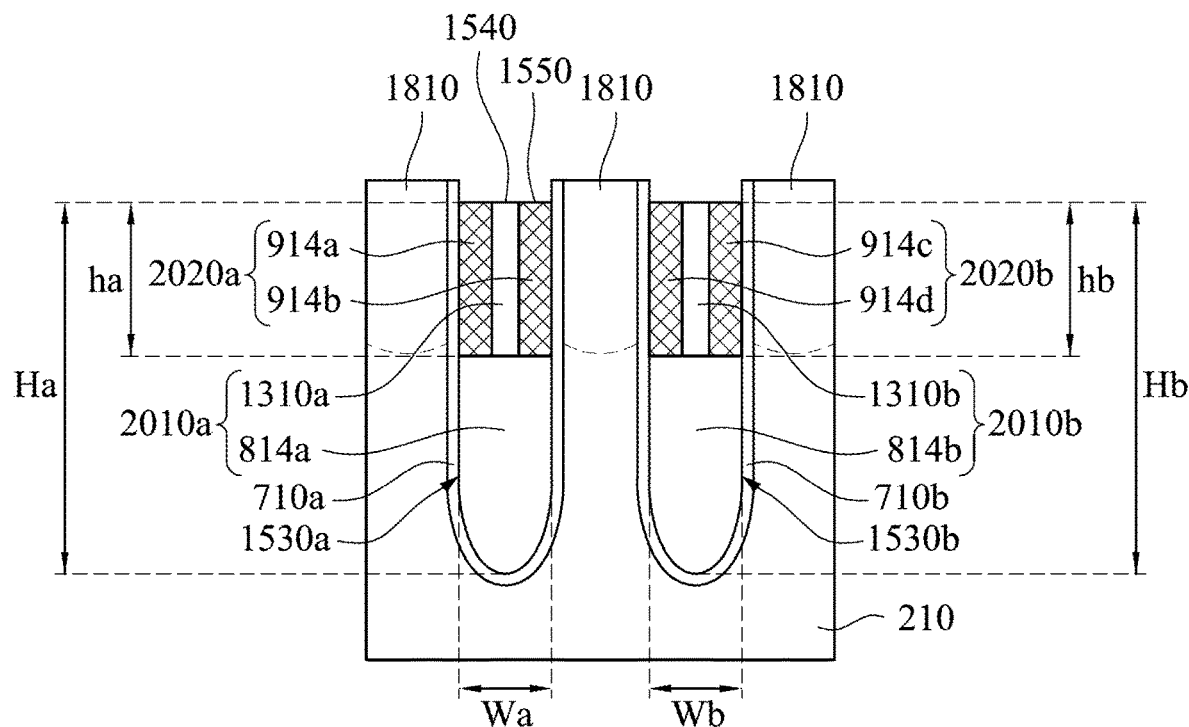
FIG. 20A to FIG. 20C are cross-sectional views illustrating a recessed access device in accordance with some embodiments of the present disclosure.
Figure 20B:
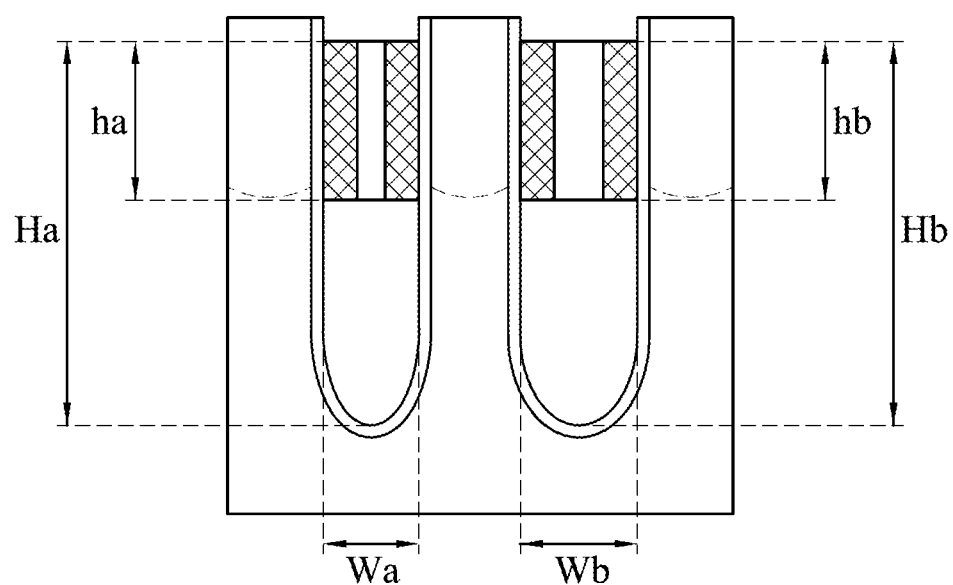
Figure 20C:
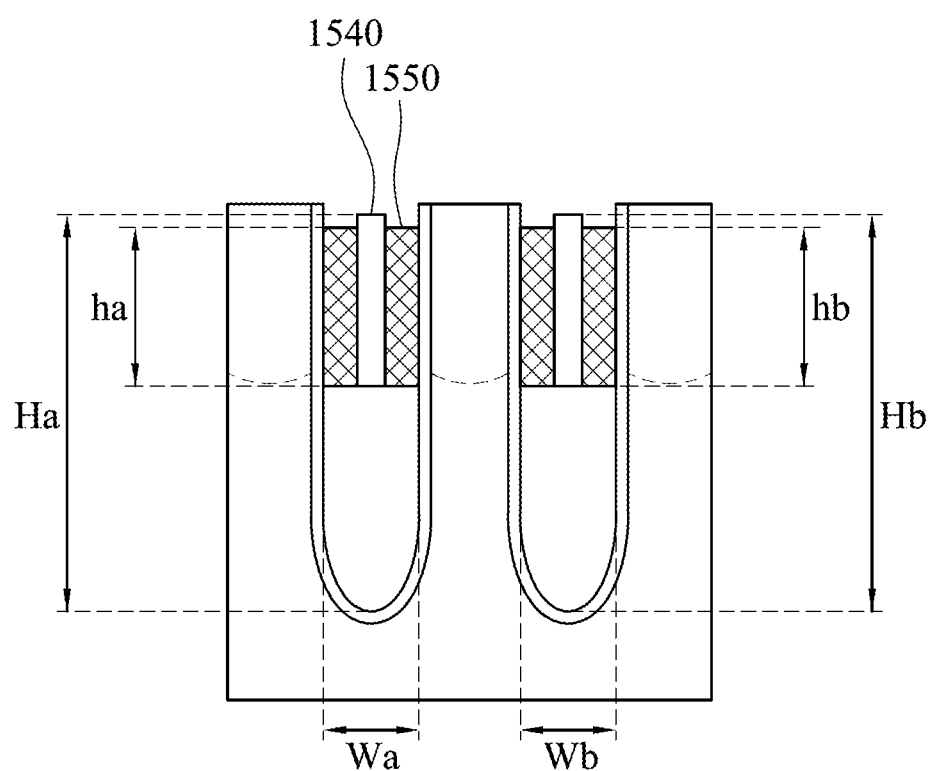

FIG. 20A to FIG. 20C are cross-sectional views illustrating a recessed access device in accordance with some embodiments of the present disclosure.

Please refer to FIG. 20A, a recessed access device (RAD) 2000 is provided. The RAD includes the substrate 210, the first RAD gate 1530a and the first gate oxide layer 710a. The first RAD gate 1530a is embedded in the substrate 210. The first gate oxide layer 710a is disposed between the substrate 210 and the first RAD gate 1530a, wherein the first RAD gate 1530a includes a first gate material 2010a and a second gate material 2020a. It is to be understood that the first gate material 2010a is the first lower part 814a of the first gate layer 810 and the portion 1310a of the third gate layer 1310 as mentioned above, in which the material of the first lower part 814a and that of the portion 1310a are the same. In some embodiments, the first gate material 2010a is titanium nitride. It is to be understood that the second gate material 2020a is the first vertical portion 914a and the second vertical portion 914b of the second gate layer 910 as mentioned above. The first gate material 2010a is disposed on the first gate oxide layer 710a, wherein the first gate material 2010a includes the first lower part 814a and the portion 1310a on the first lower part 814a. The second gate material 2020a disposed between the portion 1310a of the first gate material 2010a and the first gate oxide layer 710a.

In some embodiments, the recessed access device 2000 further includes the source/drain region 1810 embedded in the substrate 210 and adjacent to the first gate oxide layer 710a. The material of the source/drain region 1810 may include a doped semiconductor material such as silicon or germanium, a compound-doped semiconductor material such as gallium arsenide, indium arsenide, indium phosphide, or silicon carbide, or other suitable one or more of the materials. In some embodiments, a depth of the doped semiconductor material and/or the compound-doped semiconductor material is no greater than a depth of the first vertical portion 914a and/or the second vertical portion 914b of the second gate layer 910.

In some embodiments, the second upper surface 1540 of the portion 1310a of the first gate material 2010a is substantially coplanar with the first upper surface 1550 of the second gate material 2020a, as shown in FIG. 20A.

In some embodiments, the second upper surface 1540 of the portion 1310a of the first gate material 2010a is above the first upper surface 1550 of the second gate material 2020a, as shown in FIG. 20C. It is to be understood that the difference between FIG. 20A and FIG. 20C is the relative position of the second upper surface 1540 and the first upper surface 1550. Other components and configurations in FIG. 20C are the same as those in FIG. 20A.

Please still refer to FIG. 20A again, the recessed access device (RAD) 2000 further includes the second RAD gate 1530b and the second gate oxide layer 710b. The second RAD gate 1530b is embedded in the substrate 210. The second gate oxide layer 710b is disposed between the substrate 210 and the second RAD gate 1530b, wherein the second RAD gate 1530b includes a third gate material 2010b and a fourth gate material 2020b. It is to be understood that the third gate material 2010b is the second lower part 814b of the first gate layer 810 and the portion 1310b of the third gate layer 1310 as mentioned above, in which the material of the second lower part 814b and that of the portion 1310b are the same. It is to be understood that the fourth gate material 2020b is the third vertical portion 914c and the fourth vertical portion 914d of the second gate layer 910 as mentioned above. The third gate material 2010b is disposed on the second gate oxide layer 710b, wherein the third gate material 2010b includes the second lower part 814b and the portion 1310b on the second lower part 814b, and the third gate material 2010b is the same as the first gate material 2010a. The fourth gate material 2020b is disposed between the portion 1310b of the third gate material 2010b and the second gate oxide layer 710b, wherein the fourth gate material 2020b is the same as the second gate material 2020a.

Please refer to FIG. 20A and FIG. 20B, the first width Wa of the first recessed access device gate 1530a is smaller than the second width Wb of the second recessed access device gate 1530b. It is to be understood that the difference between FIG. 20A and FIG. 20B is the relative size of the first width Wa and the second width Wb. Other components and configurations in FIG. 20B are the same as those in FIG. 20A.

Refer to FIG. 20A, FIG. 20B and FIG. 20C again. In some embodiments, the height Ha of the first recessed access device gate 1530a is substantially equal to the second height Hb of the second recessed access device gate 1530b. In some embodiments, the height ha of the first vertical portion 914a and/or the second vertical portion 914b of the second gate layer 910 is equal to the height hb of the third vertical portion 914c and/or the fourth vertical portion 914d of the second gate layer 910. In some embodiments, a ratio of the height Ha of the first gate material 2010a to the height ha of the second gate material 2020a is 2:1 to 4:1, for example, but not limited, 2:1, 2.2:1, 2.5:1, 2.8:1, 3:1, 3.2:1, 3.5:1, 3.8:1, or 4:1.

The present disclosure improves the problems caused by different widths of gates of the RAD. More specifically, the present disclosure can control recess depths (or gate heights) to the same depth (or the same gate height), even though the gate widths of the RAD are different. In addition, the present disclosure can avoid GIDL in the semiconductor device. More specifically, the structure of the first gate material and the second gate material (or the third gate material and the fourth gate material) can avoid GIDL occurring between the gate and the drain in the semiconductor devices. Therefore, the present disclosure of the RAD can improve the performance of DRAM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method for a recessed access device, comprising:
   forming a trench in a substrate;
   oxidizing an inner surface of the trench to form a gate oxide layer within the substrate;
   forming a first gate layer in a bottom of the trench, wherein a portion of the gate oxide layer above the first gate layer is exposed from the trench;
   forming a second gate layer in the trench to cover the first gate layer and the portion of the gate oxide layer and form a recess over the first gate layer, wherein the second gate layer has a vertical portion covering the portion of the gate oxide layer and a horizontal portion having an upper surface exposed from the recess;

performing an ion implantation to the horizontal portion to form a doped horizontal portion;

removing the doped horizontal portion to expose the first gate layer; and forming a third gate layer to fill the recess, wherein a material of the third gate layer is the same as that of the first gate layer.

2. The manufacturing method for a recessed access device of claim 1, further comprising forming a source/drain region in the substrate and adjacent to the gate oxide layer.

3. The manufacturing method for a recessed access device of claim 1, after forming the third gate layer to fill the recess, further comprising etching back a first top portion of the third gate layer and a second top portion of the second gate layer.

4. The manufacturing method for a recessed access device of claim 3, wherein a first upper surface of the second gate layer is substantially coplanar with a second upper surface of the third gate layer, after etching back the first top portion of the third gate layer and the second top portion of the second gate layer.

5. The manufacturing method for a recessed access device of claim 3, wherein a first upper surface of the second gate layer is below a second upper surface of the third gate layer, after etching back the first top portion of the third gate layer and the second top portion of the second gate layer.

6. The manufacturing method for a recessed access device of claim 1, wherein the first gate layer is formed by an anisotropic deposition.

7. The manufacturing method for a recessed access device of claim 1, wherein the ion implantation is a blanket implantation.

8. The manufacturing method for a recessed access device of claim 1, wherein removing the doped horizontal portion to expose the first gate layer is performed by a wet etching process.

9. A recessed access device, comprising:
a substrate;
a first recessed access device gate embedded in the substrate; and
a first gate oxide layer disposed between the substrate and the first recessed access device gate, wherein the first recessed access device gate comprises:
a first gate material disposed on the first gate oxide layer, wherein the first gate material comprises a first lower portion and a first upper portion on the first lower portion; and
a second gate material disposed between the first upper portion of the first gate material and the first gate oxide layer.

10. The recessed access device of claim 9, further comprising a source/drain region embedded in the substrate and adjacent to the first gate oxide layer.

11. The recessed access device of claim 9, wherein a first upper surface of the first upper portion of the first gate material is substantially coplanar with a second upper surface of the second gate material.

12. The recessed access device of claim 9, wherein a first upper surface of the first upper portion of the first gate material is above a second upper surface of the second gate material.

13. The recessed access device of claim 9, further comprising:
a second recessed access device gate embedded in the substrate; and
a second gate oxide layer disposed between the substrate and the second recessed access device gate, wherein the second recessed access device gate comprises:
a third gate material disposed on the second gate oxide layer, wherein the third gate material comprises a second lower portion and a second upper portion on the second lower portion, and the third gate material is the same as the first gate material; and
a fourth gate material disposed between the second upper portion of the third gate material and the second gate oxide layer, wherein the fourth gate material is the same as the second gate material.

14. The recessed access device of claim 13, wherein a first width of the first recessed access device gate is smaller than a second width of the second recessed access device gate.

15. The recessed access device of claim 13, wherein a first height of the first recessed access device gate is substantially equal to a second height of the second recessed access device gate.

16. The recessed access device of claim 9, wherein a ratio of a first height of the first gate material to a second height of the second gate material is 2:1 to 4:1.

* * * * *